United States Patent [19]

Menjo et al.

[11] 4,414,737
[45] Nov. 15, 1983

[54] PRODUCTION OF SCHOTTKY BARRIER DIODE

[75] Inventors: Atsuhiko Menjo; Shinji Saitoh, both of Yokohama, Japan

[73] Assignee: Tokyo Shibaura Denki Kabushiki Kaisha, Kawasaki, Japan

[21] Appl. No.: 341,588

[22] Filed: Jan. 21, 1982

[30] Foreign Application Priority Data

Jan. 30, 1981 [JP] Japan ................................. 56-12742
Jan. 30, 1981 [JP] Japan ................................. 56-12768
Jan. 30, 1981 [JP] Japan ................................. 56-12769

[51] Int. Cl.³ ....................................... H01L 21/225
[52] U.S. Cl. ..................................... 29/578; 29/591; 148/187; 148/188
[58] Field of Search ................. 148/187, 188; 29/578, 29/591

[56] References Cited

U.S. PATENT DOCUMENTS

| | | | |
|---|---|---|---|
| 3,676,230 | 7/1972 | Rice | 148/188 X |
| 3,761,328 | 9/1973 | Abe et al. | 148/188 |
| 3,764,413 | 10/1973 | Kakizaki et al. | 148/188 |
| 3,820,235 | 6/1974 | Goldman | 29/578 |
| 3,907,617 | 9/1975 | Zwernemann | 148/187 X |
| 3,942,241 | 3/1976 | Harigaya et al. | 29/571 |
| 4,209,350 | 6/1980 | Ho et al. | 148/188 |
| 4,261,095 | 4/1981 | Dreves et al. | 29/578 X |
| 4,356,040 | 10/1982 | Fu et al. | 29/578 X |
| 4,358,891 | 11/1982 | Roesner | 29/591 X |

FOREIGN PATENT DOCUMENTS 50-157075 12/1975 Japan .

*Primary Examiner*—G. Ozaki
*Attorney, Agent, or Firm*—Finnegan, Henderson, Farabow, Garrett & Dunner

[57] ABSTRACT

A Schottky barrier diode is manufactured by first forming insulating layer on a semiconductor substrate of a first conductivity type. The insulating layer is then provided with a first opening partly exposing the substrate. Then a continuous semiconductor layer doped with an impurity of a second conductivity type is formed over the insulating layer and on the exposed surface of the substrate. The semiconductor layer is etched in the direction of thickness until those portions which lie on the insulating layer and the exposed surface of the substrate are removed, whereby a portion of the semiconductor layer remains on the side wall of the insulating layer which defines the first opening, and a second opening is formed partly exposing the substrate within the first opening. A guard ring region is then formed in a surface region of the semiconductor substrate by diffusing the impurity from the remaining doped semiconductor layer. Finally, a metal layer is formed on the exposed semiconductor substrate surface within the second opening, thus obtaining a Schottky barrier diode.

9 Claims, 13 Drawing Figures

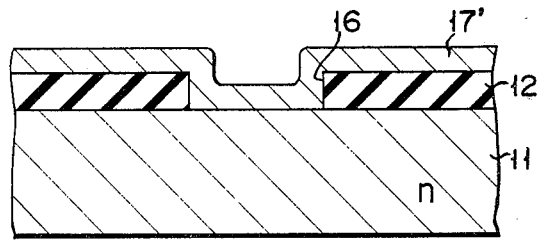
F I G. 3A
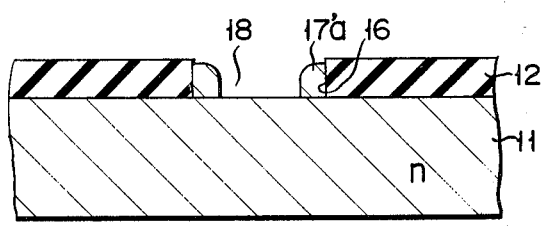
F I G. 3B
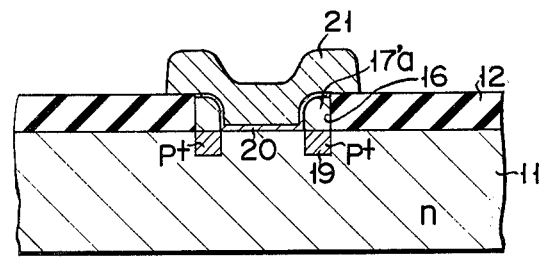
F I G. 3C

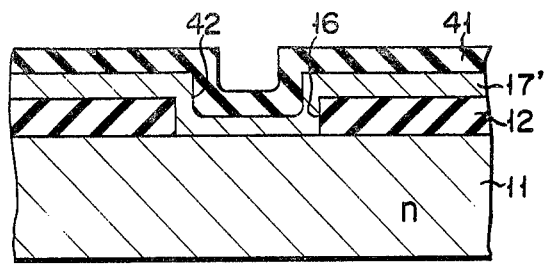
F I G. 4A
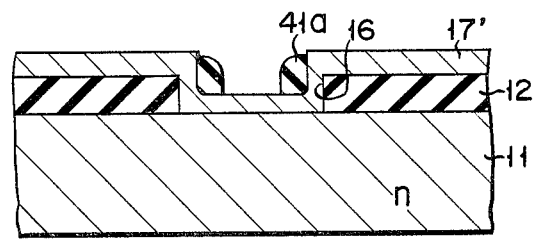
F I G. 4B
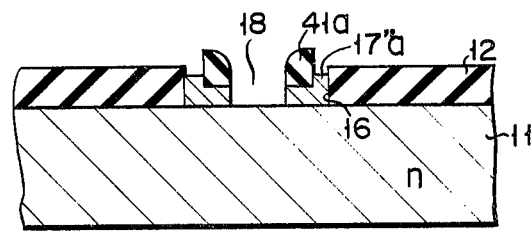
F I G. 4C
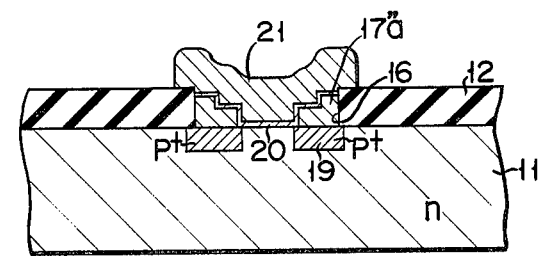
F I G. 4D

PRODUCTION OF SCHOTTKY BARRIER DIODE

BACKGROUND OF THE INVENTION

I. Field of the Invention

This invention relates to the production of a Schottky barrier diode and, more particularly, to a Schottky barrier diode provided with a guard ring region and a method of manufacturing the same.

II. Description of the Prior Art

A rectifying element which makes use of a barrier formed at the interface or junction between a metal and a semiconductor (i.e., a Schottky barrier) is usually called a Schottky barrier diode. With this diode, the forward voltage and also parasitic capacitance are low as compared with the ordinary p-n junction diode, so that it finds extensive applications in ICs and LSICs. However, since the edge of the interface between the metal and semiconductor constituting the Schottky barrier is usually contiguous to an insulating film (mostly oxide film), when a reverse voltage is applied, electric field concentration is liable to occur at the end adjacent to the aforementioned oxide film or charges are likely to be injected into the oxide film. As a result, an inversion layer is formed in a surface region of the semiconductor and the breakdown voltage is significantly lowered.

In order to overcome this drawback, it has been the practice to dope a surface region of the semiconductor substrate contiguous to the oxide film with an impurity of the opposite conductivity type to the conductivity type of the substrate so as to form a guard ring region. The provision of this guard ring region solves the problems of the electric field concentration and charge injection into the oxide film mentioned above. A Schottky barrier diode provided with such a guard ring region is usually produced in the manner as shown in FIG. 1. As is shown, on the surface of a semiconductor substrate 1, for instance of n-conductivity type, is formed an oxide film 2 by thermal oxidation. The oxide film 2 is then photoetched to form an opening 3 partly exposing the surface of the substrate 1. Then, the exposed surface region of the substrate is doped with a p-type impurity along the side wall of the oxide film 2 defining the opening 3 to form a guard ring region 4. Thereafter, a metal layer is selectively vapor deposited on the semiconductor substrate surface portion within the opening 3 and is converted to a silicide layer 5 through a thermal treatment. Finally, an aluminum lead layer 6 is formed to complete the Schottky barrier diode.

In the above prior art method, however, mask alignment is necessary for doping with the p-type impurity in the step of forming the guard ring region 4. This means that an extra allowance or margin has to be provided for the mask alignment in the layout of the opening 3 in the oxide film, thus increasing the area of the Schottky barrier region and reducing the integration density.

SUMMARY OF THE INVENTION

An object of the invention is to provide a method of manufacturing a Schottky barrier diode, which permits manufacturing a Schottky barrier diode having a guard ring region and a high integration density.

Another object of the invention is to provide a method of manufacturing a Schottky barrier diode, which does not require any mask alignment when forming a guard ring region.

To manufacture a Schottky barrier diode according to the invention, an insulating layer is first formed on a semiconductor substrate of a first conductivity type. The insulating layer is then provided with a first opening partly exposing the substrate. Then a continuous semiconductor layer doped with an impurity of a second conductivity type is formed over the insulating layer and on the exposed surface of the substrate. The semiconductor layer is etched in the direction of thickness until those portions which lie on the insulating layer and the exposed surface of the substrate are removed, whereby a portion of the semiconductor layer remains on the side wall of the insulating layer which defines the first opening, and a second opening is formed partly exposing the substrate within the first opening. A guard ring region is then formed in a surface region of the semiconductor substrate by diffusing the impurity from the remaining doped semiconductor layer. Finally, a metal layer is formed on the exposed semiconductor substrate surface within the second opening, thus obtaining a Schottky barrier diode.

According to the invention, the guard ring region is formed by using as a diffusion source an annular portion obtained by selectively etching the impurity-doped semiconductor layer formed to cover the insulating layer inclusive of the first opening. The diffusion source according to the invention can be formed without need of any mask alignment, and thus the guard ring region can be formed without need of any mask alignment but as a self-aligned region. Thus, according to the invention a Schottky barrier diode can be produced with a high integration density.

In a first embodiment of the invention, after the formation of the insulating layer on the semiconductor substrate, a film having a selective etching tendency with respect to the insulating layer is formed thereon. A hole is the made in the film. Through the hole the insulating layer is isotropically etched, thus making the first opening in the insulating layer. As a result, the first opening is partly covered by that portion of the film which surrounds the first opening and overhangs it.

The aforementioned continuous doped semiconductor layer is then formed and etched in the manner as mentioned above, whereby only a portion of the doped semiconductor layer is left as the aforementioned diffusion source under the overhang while also the second opening is formed.

In a second embodiment of the invention, after the formation of the insulating layer on the semiconductor substrate and also formation of the first opening therein, the aforementioned doped semiconductor layer is directly formed to cover the insulating layer and exposed substrate surface within the first opening. The doped semiconductor layer is then etched anisotropically in the thickness direction until those portions which lie on the insulating layer and the exposed surface of the substrate are removed. Thus, the doped semiconductor layer remains only on and along the side wall of the insulating layer which defines the first opening to provide the aforementioned diffusion source, while at the same time the aforementioned second opening is formed.

In a third embodiment of the invention, after the formation of the insulating layer on the semiconductor substrate and formation of the aforementioned first opening therein, the doped semiconductor layer is directly formed on the insulating layer and in the first opening. This doped semiconductor layer defines a recess corresponding to the first opening. A film having a selective etching tendency with respect to the doped semiconductor layer is formed on the doped semiconductor layer. The film is then etched to remain only on the vertical side wall of the recess of the doped semiconductor layer. The doped semiconductor layer is then etched in the manner as mentioned above with the remaining film used as a mask. Thus, the doped semiconductor layer is left only under the remaining film, thus providing the diffusion source, while at the same time the second opening is formed. The remaining film is removed before forming the aforementioned metal layer.

A film having "a selective etching tendency" used throughout the specification is intended to mean a film which has an etching rate differing from that of a layer supporting it (i.e., the insulating layer or doped semiconductor layer) by three to ten times or more under the same etching condition.

The Schottky barrier diode obtained by the method according to the invention is also within the scope of the invention.

BRIEF DESCRIPTION OF THE DRAWINGS

FIGS. 3A through 3C are sectional views illustrating successive steps in the method of manufacturing a Schottky barrier diode according to a second embodiment of the invention; and FIGS. 4A through 4D are sectional views illustrating successive steps in the method of manufacturing a Schottky barrier diode according to a third embodiment of the invention.

DETAILED DESCRIPTION OF THE PREFERRED EMBODIMENTS

Figure 1:
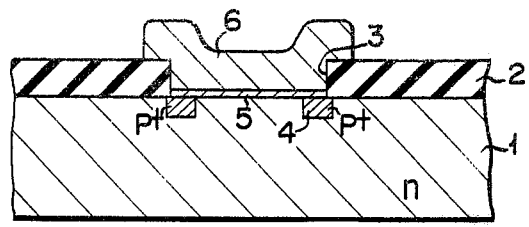
FIG. 1 is a sectional view showing a prior art Schottky barrier diode.

This invention will now be described with reference to the drawings. Throughout the drawings the same parts or portions are denoted by the same reference numerals.

A first embodiment of manufacturing a Schottky barrier diode according to the invention will be described with reference to FIGS. 2A to 2E.

Figure 2A:
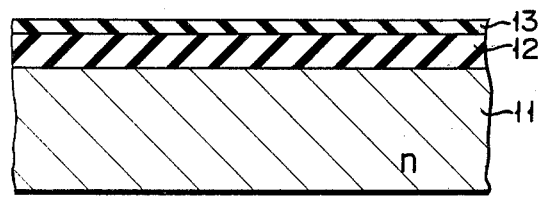
FIGS. 2A through 2E are sectional views illustrating successive steps in the method of manufacturing a Schottky barrier diode according to a first embodiment of the invention.

As shown in FIG. 2A, on the main surface of a semiconductor substrate of a first conductivity type, for instance an n-type silicon substrate 11, an insulating layer 12 is formed to a thickness of 1,000 to 3,000 Å. This insulating layer 12 may be a thermal silicon oxide formed by thermally oxidizing the substrate 11 or a silicon dioxide layer formed by chemical vapor deposition (CVD). Then, a film 13 as, for example, silicon nitride film, having a selective etching tendency with respect to the insulating layer 12 is formed on the insulating layer 12 to a thickness smaller than that of the insulating layer 12, for instance to 500 to 1,000 Å.

Figure 2B:
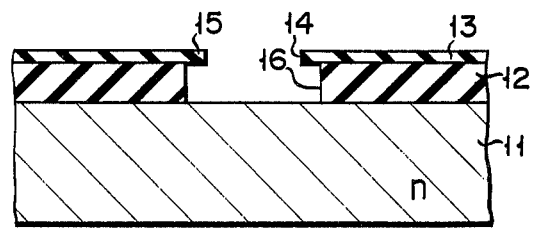

Subsequently, as shown in FIG. 2B, an opening or hole 14 is formed by usual photoetching techniques in a given portion of the silicon nitride film 13. Then, using the remaining silicon nitride film 13 as a mask the insulating layer 12 is etched through the hole 14 such that it is etched laterally as well, thus forming an opening 16 in the insulating layer 12. This etching may be done by using a liquid etchant, for instance dilute HF. In this way, an overhang 15 of the silicon nitride film 13 is formed with respect to the opening 16.

Figure 2C:
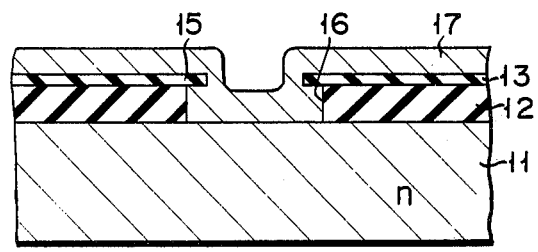

Thereafter, as shown in FIG. 2C, a continuous layer 17 of polycrystalline silicon doped with a p-type impurity, for instance boron (with a concentration of $1 \times 10^{18}$ to $1 \times 10^{20} cm^{-3}$) is formed by the usual method to cover the silicon nitride film 13 inclusive of the opening 16. At this time, the doped polycrystalline silicon is also caused to deposit under the overhang 15. To this end, the polycrystalline silicon layer 17 is deposited such that the thickness of the polycrystalline silicon layer 17 on the silicon nitride film 13 is at least one half the thickness of the insulating layer 12.

Figure 2D:
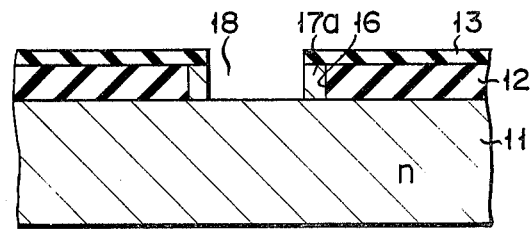

Then, as shown in FIG. 2D, the polycrystalline silicon layer 17 thus formed is uniformly etched in the thickness direction to an extent corresponding to its thickness on the insulating layer 12. Namely, the layer 17 is etched until those portions which lie on the nitride film 13 and the exposed surface of the substrate 11 within the opening 16 are removed. This etching may be done by anisotropic etching such as reactive ion etching, plasmic etching, ion beam etching and spattering etching, or wet etching using a liquid etchant. As a result of this etching, the polycrystalline silicon layer 17 is left only under the overhang 15, i.e., only on the side wall of the insulating layer 12 which defines the opening 16 to provide an annular diffusion source 17a, while at the same time an opening 18 is formed, partly exposing the silicon substrate.

Figure 2E:
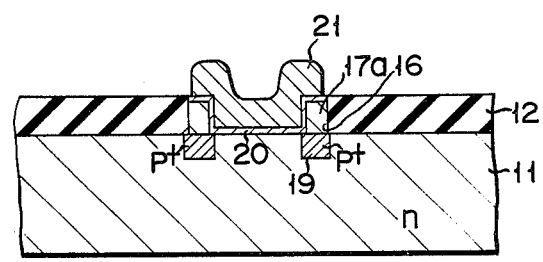

The structure of FIG. 2D is then subjected to a heat treatment to cause diffusion of the p-type impurity from the diffusion source 17a into the silicon substrate 11 to form a p+-type guard ring region 19 therein. Then, the silicon nitride film 13 is removed, and a metal, for instance platinum, is vapor deposited on the entire exposed surface of the remaining polycrystalline silicon layer 17a and the exposed surface of the silicon substrate 11 in the opening 18 and then thermally treated to convert it into a silicide layer 20, as shown in FIG. 2E. Finally, aluminum is vapor deposited and patterned to form a lead layer 21 in contact with the silicide layer 20. In this way, a desired Schottky barrier diode can be obtained. After the formation of the guard ring region 19, it is possible to remove the diffusion source 17a before forming the silicide layer 20. Also, it is possible to obtain a Schottky barrier by forming the aluminum lead layer 21 without forming the silicide layer 20.

FIGS. 3A through 3C illustrate a second embodiment of the invention. In this embodiment, an insulating layer 12 is formed on an n-type silicon substrate 11, as described with reference to FIG. 2A. The insulating layer 12 is then etched to form an opening 16 as shown in FIG. 3A. Subsequently, a doped polycrystalline silicon layer 17' like that mentioned earlier in connection with FIG. 2C is directly formed on the insulating layer 12 and in the opening 16.

The doped layer 17' is then anisotropically etched in the thickness direction to an extent corresponding to its thickness on the insulating layer 12. Namely, the doped layer 17' is etched until those portions which lie on the insulating layer 12 and the exposed surface of the substrate 11 in the opening 16 are removed. Since the doped layer 17' has been deposited to a greater thickness on the side wall of the layer 12 which defines the opening 16 than the other portion, when anisotropically etched, it remains only on the side wall of the layer 12 which defines the opening 16 to provide a diffusion source 17a', while at the same time an opening 18 partly exposing the substrate 11 within the opening 16 is formed in the film 17'. (FIG. 3B).

Thereafter, a guard ring region 19, a silicide layer 20 and an aluminum lead 21 are formed in the same manner as described before in connection with FIG. 2E, thus obtaining a Schottky barrier diode as shown in FIG. 3C.

FIGS. 4A through 4D illustrate a third embodiment of the invention. In this embodiment, after forming an oxide film 12 on a substrate 11, forming an opening 16 therein and forming a doped layer 17' in the same manner as described before in connection with FIG. 3A, a film 41 having a selective etching tendency with respect to the doped layer 17' is formed thereon (FIG. 4A). The doped layer 17' defines a recess 42 corresponding to the opening 16. The film 41 may be made of CVD-silicon oxide, doped glass such as phosphorus-doped silicate glass (PSG), arsenic-doped silicate glass (AsSG) and boron-doped silicate glass (BSG) or silicon nitride.

The film 41 is then anisotropically etched in the thickness direction to an extent corresponding to its thickness over the insulating layer 12. Thus, the film 41 remains as a portion 41a only on the side wall of the recess 42 (FIG. 4B).

The doped layer 17' is then etched by wet etching with the remaining film 41a used as a mask. Thus, the doped layer 17' is removed except for a portion under the mask 41a and on the side wall of the insulating layer 12 which defines the opening 16, the remaining portion serving as a diffusion source 17a'', while at the same time an opening 18 partly exposing the substrate 11 in the opening 16 is formed (FIG. 4C).

Thereafter, the mask is removed, and a guard ring region 19, a silicide layer 20 and a lead layer 21 are formed in the same manner as described earlier in connection with FIG. 2E to obtain a Schottky barrier diode as shown in FIG. 4D.

Although this invention has been described with reference to the preferred embodiments, the invention should not be limited thereto. For example, the substrate may be formed of III - V Group compound semiconductor represented by gallium arsenide. In such a case, a Group II element such as zinc, cadmium and beryllium can provide a p-type impurity. Further, the doped layer may also be formed of amorphous silicon or monocrystalline silicon.

What we claim is:

1. A method of manufacturing a Schottky barrier diode comprising:
    forming an insulating layer on the surface of a semiconductor substrate of a first conductivity type;
    forming a first opening in said insulating layer, partly exposing the surface of said substrate;
    forming a continuous semiconductor layer doped with an impurity of a second conductivity type opposite to said first conductivity type over said insulating layer and on said exposed substrate surface in said first opening;
    etching said doped semiconductor layer in the direction of thickness thereof until those portions which lie on the insulating layer and the exposed surface of the substrate are removed to provide as a diffusion source a portion of said doped semiconductor layer remaining on the side wall of said insulating layer which defines said first opening and also form a second opening partly exposing said semiconductor substrate surface within said first opening;
    causing diffusion of said impurity from said diffusion source into said semiconductor substrate to form a guard ring region therein; and
    forming a metal layer on said exposed semiconductor substrate surface within said second opening, said metal layer forming a Schottky barrier with said semiconductor substrate.

2. A method according to claim 1, wherein a film having a selective etching tendency with respect to said insulating layer is formed on said insulating layer; a hole is made in the film; said insulating layer is isotropically etched through the hole in the film, thus making said first opening in said insulating layer, said first opening being partly covered by that portion of the film which surrounds said first opening to form an overhang; said doped semiconductor layer is formed and etched to provide said diffusion source under said overhang and to make said second opening; and said film is removed to expose the insulating layer before the metal layer is formed.

3. A method according to claim 2, wherein said film is made of silicon nitride.

4. A method according to claim 2, wherein said doped semiconductor layer is formed such that the thickness of the doped semiconductor layer portion which lie on the film is at least one half the thickness of the insulating layer.

5. A method according to claim 1, wherein said doped semiconductor layer is formed directly on said insulating layer and in said first opening, and is anisotropically etched to provide said diffusion source and make said second opening.

6. A method according to claim 1, wherein said doped semiconductor layer is formed directly on said insulating layer and in said first opening, said doped semiconductor layer defining a recess corresponding to said first opening; a film having a selective etching tendency with respect to said doped semiconductor layer is formed on said doped semiconductor layer; said film is etched such that a portion remain on the side wall of said recess; the doped semiconductor layer is etched with the remaining portion of said film used as a mask to provide said diffusion source and make said second opening; and the remaining portion of said film is removed before said metal layer is formed.

7. A method according to claim 6, wherein said film is made of doped glass, chemical vapor-deposited silicon oxide or silicon nitride.

8. A method according to any one of claims 1-7, wherein said substrate is formed of silicon.

9. A method according to claim 8, wherein said insulating layer is formed of silicon oxide.

* * * * *